United States Patent [19]

Kittaka et al.

[11] Patent Number: 4,939,403
[45] Date of Patent: Jul. 3, 1990

[54] ENERGY-TRAPPING-BY-FREQUENCY-LOWERING-TYPE PIEZOELECTRIC RESONANCE DEVICE

[75] Inventors: Toshihiko Kittaka; Akira Ando; Yukio Sakabe, all of Kyoto, Japan

[73] Assignee: Murata Manufacturing Co., Ltd., Japan

[21] Appl. No.: 291,793

[22] Filed: Dec. 29, 1988

[30] Foreign Application Priority Data

Dec. 29, 1987 [JP] Japan .................. 62-335920

[51] Int. Cl.⁵ .............................. H01L 41/08
[52] U.S. Cl. ......................... 310/320; 310/358; 310/366; 310/359
[58] Field of Search ............. 310/320, 366, 358, 359

[56] References Cited

U.S. PATENT DOCUMENTS

| 3,590,287 | 6/1971 | Berlincourt | 310/359 X |
| 3,961,210 | 6/1976 | Nagata et al. | 310/320 |
| 4,564,782 | 1/1986 | Ogawa | 310/358 X |
| 4,605,876 | 8/1986 | Ogawa et al. | 310/358 |
| 4,649,313 | 3/1987 | Ogawa et al. | 310/358 |
| 4,652,784 | 3/1987 | Inoue et al. | 310/320 |
| 4,714,848 | 12/1987 | Chen | 310/358 X |
| 4,742,264 | 5/1988 | Ogawa | 310/359 X |

FOREIGN PATENT DOCUMENTS 0123122 7/1985 Japan ....................... 310/320

*Primary Examiner*—Mark O. Budd
*Attorney, Agent, or Firm*—Ostrolenk, Faber, Gerb & Soffen

[57] ABSTRACT

An energy trapping type piezoelectric resonance device utilizing higher-order harmonics of the thickness extensional vibration mode comprising a body formed of a piezoelectric material and three or more electrodes arranged overlapping with each other and separated by the piezoelectric material layers in the direction of thickness of the body, wherein respective portions of the piezoelectric material layers interposed between the electrodes are polarized and at least respective portions of the piezoelectric material layers which are not interposed between the electrodes is polarized.

6 Claims, 6 Drawing Sheets

ENERGY-TRAPPING-BY-FREQUENCY-LOWERING-TYPE PIEZOELECTRIC RESONANCE DEVICE

CROSS REFERENCE TO RELATED APPLICATION

Related copending applications of interest to the present application are U.S. Ser. No. 215,549 filed on Jul. 6, 1988, and U.S. Ser. No. 211,777 filed Jun. 27, 1988, both assigned to the same assignee.

BACKGROUND OF THE INVENTION

1. Field of the Invention

The present invention relates to a piezoelectric resonance device and, more specifically, to an energy trapping type piezoelectric resonance device utilizing the mode of thickness extensional vibration.

2. Description of the Background Art

U.S. Pat. No. 3,384,768 discloses an energy trapping type piezoelectric-resonator utilizing the mode of thickness extensional vibration, which is prepared from Pb(Zr, Ti)O$_3$ (PZT) piezoelectric ceramics. This energy trapping type piezoelectric-resonator is formed of a piezoelectric ceramic plate and electrodes are formed on both sides of the piezoelectric ceramic plate, with each of the electrodes having a smaller area than the piezoelectric ceramic plate. The piezolelectric ceramic plate is formed of a material such as PZT system having an effective Poisson's ratio of at least 166. Utilizing a material having an effective Poisson's ratio of less than $\frac{1}{3}$, it is impossible to obtain a frequency lowering type energy trapping piezoelectric resonance device using the fundamental thickness extensional mode.

It is desirable to improve the aforementioned piezoelectric-resonator, for use in a higher frequency range. In order to vibrate such a piezoelectric-resonator in a higher frequency range, the piezoelectric ceramic plate may be reduced in thickness. However, the lower limit of the thickness is about 200 $\mu$m in view of handling problems, and it is difficult to further reduce the thickness in practice. Thus, the actual frequency range that has been attained with the thickness fundamental vibration mode has been not more than 10 MHz.

On the other hand, it may be possible to use a piezolelectric-resonator in a higher frequency range by utilizing the third harmonic of thickness mode vibration. However, the response level of the third harmonic is considerably lower than that of the fundamental vibration, so the third harmonic has not generally been usable in the past.

Further, in a conventional piezoelectric-resonator utilizing the mode of thickness extensional vibration, it has been impossible to trap vibration energy by using a frequency lowering method unless the material thereof has an effective Poisson's ratio of at least $\frac{1}{3}$. Therefore, only a limited number of materials have been usable.

In addition, in a conventional piezoelectric-resonator, the energy is not well trapped and it has been impossible to fully eliminate spurious outputs superimposed on the resonance waveform. Therefore, a low level of spurious outputs, i.e. ripples, in this frequency range have prevented the utilization of such a device as a filter, and as to its utilization as an oscillator, it had the disadvantage that its Qm becomes lower.

SUMMARY OF THE INVENTION

An object of the present invention is to provide a piezoelectric resonance device capable of more effectively trapping energy.

Another object of the present invention is to provide a piezoelectric resonance device capable of providing higher Qm and of more effectively reducing spurious output level.

According to the present invention, provided is an energy trapping type piezoelectric resonance device utilizing the mode of thickness extensional vibration. This device comprises a plate shaped body comprisins piezoelectric material layers and electrodes provided so as to be opposed to each other through the layers of the piezoelectric material in the direction of thickness of the body for trapping vibration energy. The piezoelectric material layer interposed between each pair of the electrodes is polarized, and at least a portion of the piezoelectric material layer which is not interposed between the electrodes is also polarized.

In accordance with another aspect of the present invention, there are three or more electrodes and the piezoelectric material layers interposed between the electrodes are polarized in alternating directions in the direction of thickness. In accordance with a further aspect of the present invention, the direction of polarization is the same in the direction of thickness.

In accordance with a still further aspect of the present invention, the device further comprises connection conductive portions for coupling the electrodes to side edges of the body formed of piezoelectric material layers, and at least those of the connection conductive portions which have different potentials from each other when driven are formed not to be overlapped with each other in the direction of thickness.

In accordance with a still further aspect of the present invention, the piezoelectric material has such an effective Poisson's ratio that in prior art devices is incapable of frequency lowering type energy trapping of the thickness extensional fundamental vibration.

In accordance with a still further aspect of the present invention, there is an odd numbers of electrodes, and an even-number higher-order harmonic vibration mode is utilized.

In accordance with the present invention, not only those portions of the piezoelectric material layers which are interposed between the electrodes but also at least a portion of the piezoelectric material layers which is not interposed between the electrodes are polarized. Consequently, more effective energy trapping has become possible, the spurious outputs are superimposed very little on the resonance waveform, and high Qm can be provided.

When the piezoelectric resonance device is used as a filter, the generation of ripples in the frequency range utilized can be suppressed. When the piezoelectric resonance device is used as an oscillator, high Qm can be provided, realizing an oscillator of high performance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The inventors of the present application have worked hard to provide a piezoelectric resonance device suitable for use in a high frequency range, capable of utilizing a piezoelectric material selected from a wider range of materials than were previously usable and capable of realizing sufficient energy trapping. They have developed a piezoelectric resonance device of a multilayered type comprising a plate-shaped body formed of piezoelectric material layers and three or more electrodes provided to be overlapped with each other, separated by the piezoelectric material layers in the direction of thickness of the body. The device further comprises connection conductive portions extending to side edges of the body from the electrodes, the electrodes being vibration electrodes for trapping vibration energy. Consequently, an energy trapping type piezoelectric resonance device, which can be used in a higher frequency range than previously is provided.

In the stacked type piezoelectric resonance device, three or more electrodes are arranged overlapping with each other through the piezoelectric material layers in the direction of the thickness. Therefore, compared with a conventional single plate type piezoelectric resonance device having the same thickness, the first response frequency of the thickness extensional vibration mode appears (n−1) times higher than that of the conventional device (where n represents the number of electrodes). Thus, the device can be used in a higher frequency range. In addition, since the device has a plurality of piezoelectric material layers divided by three or more electrodes, the limits and conditions imposed on the device as regards the standing waves transmitted through the piezoelectric material layers are different from the limits and conditions on the conventional single plate type piezoelectric resonance device. Therefore, the energy of the thickness extensional vibration can be trapped by frequency lowering even if the piezoelectric material has an effective Poisson's ratio of less than $\frac{1}{3}$, which it was impossible to trap the vibration energy of the fundamental thickness extensional mode in the conventional single plate type device by frequency lowering.

In the following, a description will be given of the piezoelectric resonance device capable of sufficient energy trapping and capable of better reducing the spurious outputs superimposed on the resonance waveform.

Figure 1:
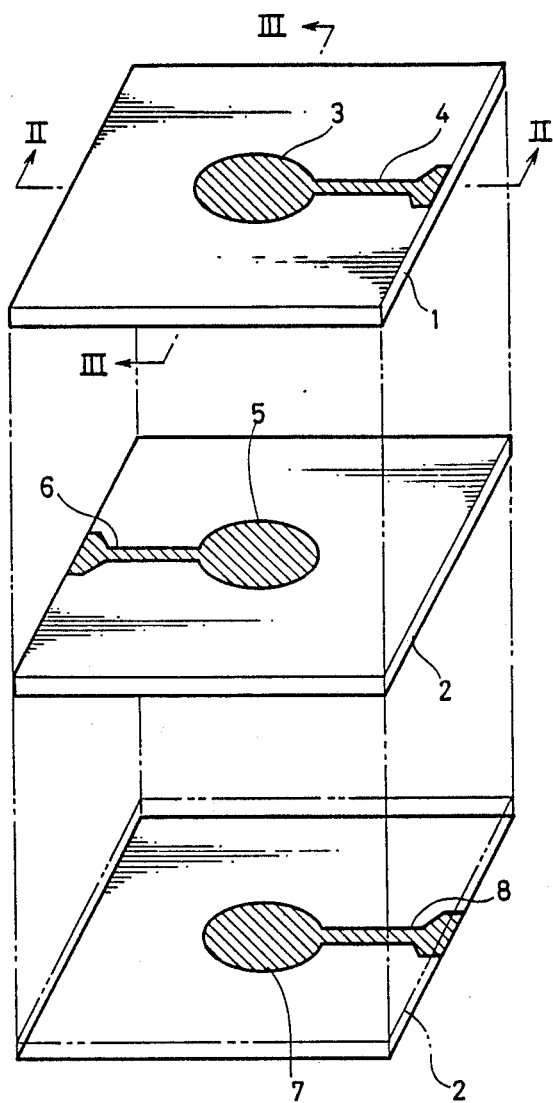
FIG. 1 is a perspective view showing, in an exploded manner, the piezoelectric resonance device in accordance with one embodiment of the present invention.
Figure 2:
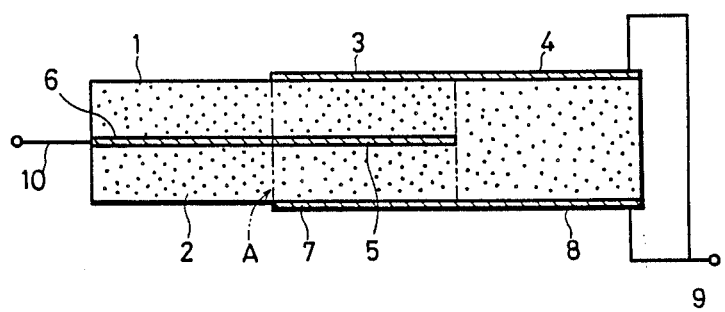
FIG. 2 is a cross sectional view taken along the line II—II of FIG. 1.
Figure 3:
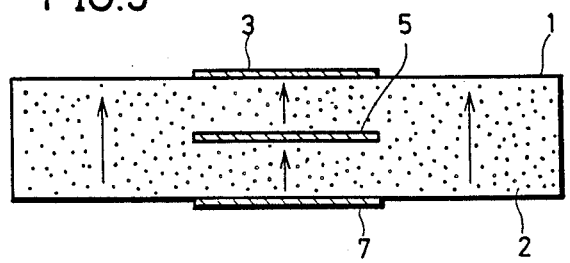
FIG. 3 is a cross sectional view taken along the line III—III of FIG. 1.

FIG. 1 is a perspective view of the piezoelectric resonance device in accordance with one embodiment of the present invention, which is exploded to show the state before firing, for convenience. FIG. 2 is a cross sectional view taken along the line II—II of FIG. 1, and FIG. 3 is a cross sectional view taken along the line III—III of FIG. 1. In FIG. 3, arrows are written to show the direction of polarization, for convenience.

Referring to FIG. 1, the piezoelectric resonance device has two ceramic sheets 1 and 2. An electrode 3 is formed on a circular region on the upper surface of the ceramic sheet 1 to trap energy. A connection conductive portion 4 is formed extending from the electrode 3 to one edge of the ceramic sheet 1. An electrode 5, which will be an inner electrode of the piezoelectric resonance device, is formed on the upper surface of the ceramic sheet 2. A connection conductive portion 6 is formed between the electrode 5 and one edge of the ceramic sheet 2. An electrode 7 is formed on the lower surface of the ceramic sheet 2, as shown in a perspective manner through the ceramic sheet 2 in FIG. 1. The electrode 7 constitutes the other electrode for trapping energy. A connection conductive portion 8 is formed between the electrode 7 and the other edge of the ceramic sheet 2.

Referring to FIG. 2, a common lead wire 9 is connected to end portions of the connection conductive portions 4 and 8 formed on the upper and lower ends on the edges of the ceramic sheets 1 and 2. Another lead wire 10 is connected to an end of the connection conductive portion 6 on the edges of the ceramic sheets 1 and 2. The region A surrounded by two dotted lines in FIG. 2 represents a region in which the electrodes 3, 5 and 7 are opposed to each other.

As shown in FIGS. 2 and 3, the ceramic sheet 1 and the ceramic sheet 2 are fired to be integral with each other. As shown in FIG. 3, the ceramic sheets 1 and 2 are polarized in the direction of the arrows. Namely, in this case, the direction of polarization of the ceramic sheets 1 and 2 interposed between the electrodes 3, 5 and 7 is the same in the direction of the thickness. Portions which are not interposed between the electrodes 3, 5 and 7 are also polarized in the same direction.

Either + or − voltage may be applied to the lead wire 9 and lead wire 10 is connected to ground.

Now, in the above described piezoelectric resonance device, the electrodes 3, 5, and 7 are arranged overlapping with each other in the direction of thickness of the piezoelectric resonance device. Therefore, the device can be used in a higher frequency range compared with the conventional single plate type piezoelectric resonance device having the same thickness. The reason for this is that the mode of thickness extensional vibration is generated with the distance between the electrodes 3 and 5 or the electrodes 5 and 7 being $\lambda/2$ ($\lambda$ is wave length).

In addition, as is apparent from FIG. 3, not only the portions of the piezoelectric material layers interposed between the electrodes 3, 5 and 7 but also the portions of the piezoelectric material layers which are not interposed between the electrodes are polarized. Consequently, the resonance frequency at the portions on which electrodes are formed in lowered much, so that better energy trapping is realized.

Figure 4:
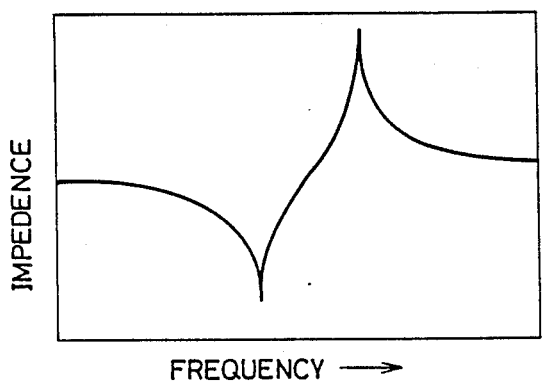
FIG. 4 is a graph showing a resonance frequency characteristic of the embodiment of FIG. 1.

FIG. 4 shows the resonance frequency characteristic of the present embodiment.

Figure 11:
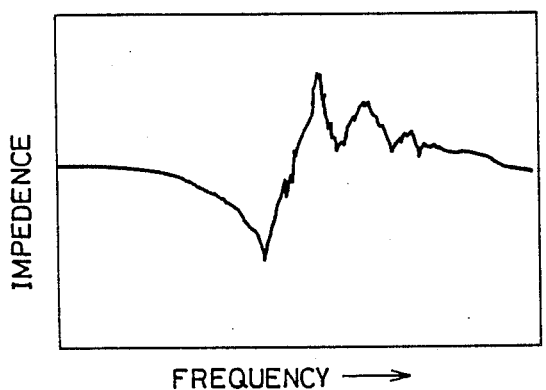
FIG. 11 is a graph showing the resonance frequency characteristic of the example of FIG. 10.
Figure 10:
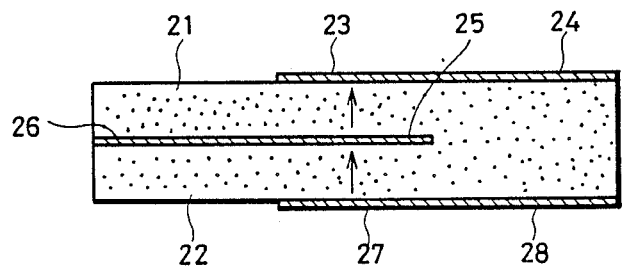
FIG. 10 is a cross sectional view of a device for comparison with the example of FIG. 2.

For comparison, a piezoelectric resonance device such as shown in FIG. 10 is prepared. FIG. 10 corresponds to FIG. 2 or FIG. 3. Referring to FIG. 10, provided are a pair of ceramic sheets 21 and 22. An electrode 23 and a connection conductive portion 24 are formed on the upper surface of the ceramic sheet 21. An electrode 25 and a connection conductive portion 26 are formed on the upper surface of the ceramic sheet 22. In addition, an electrode 27 and a connection conductive portion 28 are formed on the lower surface fo the ceramic sheet 22. Only those portions of the piezoelectric material layers which are interposed between the electrodes 23, 25 and 27 for energy trapping are polarized. Consequently, when the piezoelectric resonance device shown in FIG. 10 is driven, the resonance frequency characteristic is not clear, and, as shown in FIG. 11, there are large spurious outputs and the impedance ratio between the impedance at the anti resonance frequency and the impedance at the resonance frequency becomes considerably small. In this case, Qm is 320 and the impedance ratio between the impedance at the anti resonance frequency and the impedance at the resonance frequency is 53 dB. Meanwhile, as to the piezoelectric resonance device in accordance with the present invention, there is very little spurious output as shown in FIG. 4. In this case, Qm is 1320 and the impedance ratio between the impedance at the anti resonance frequency and the impedance at the resonance frequency is 72 dB.

In the following, the method for manufacturing the piezoelectric resonance device shown in FIGS. 1 to 3 will be described.

Figure 5A:
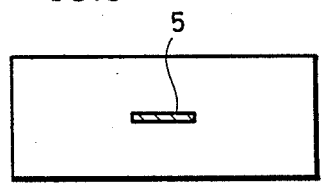
FIGS. 5A to 5D are vertical sectional views showing the steps of manufacturing the piezoelectric device in accordance with the embodiment of FIG. 1.
Figure 5B:
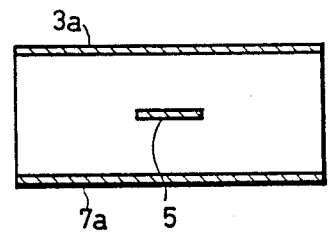
Figure 5C:
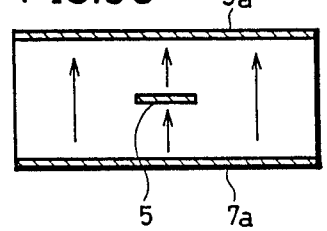

First, two ceramic green sheets are prepared. An electrode paste for forming the electrode 5 and a connection conductive portion 6 is applied to the upper surface of the lower ceramic green sheet 2. Thereafter, the ceramic green sheets 1 and 2 are stacked under pressure. By firing the stacked body, a structure as shown in FIG. 5A is provided. Silver is deposited on the upper and lower end surfaces of the burned body to form external electrodes 3a and 7a on the entire surfaces. Thereafter, a voltage is applied between the external electrode 3a and the external electrode 7a to polarize the whole piezoelectric resonance device as shown in FIG. 5C. Thereafter, a resist ink is printed on the surfaces of the external electrodes 3a and 7a. Patterning and etching are carried out to selectively remove the external electrodes 3a and 7a to provide the electrodes 3 and 7 as shown in FIG. 5. Through these steps, the piezoelectric resonance device shown in FIGS. 1 to 3 is provided.

Figure 6:
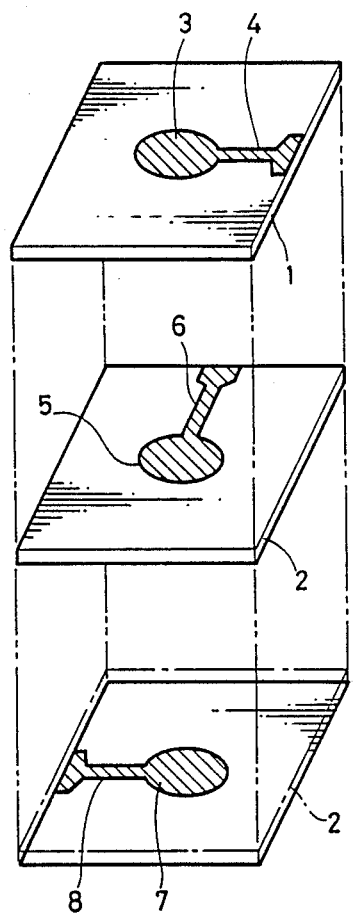
FIG. 6 is perspective view corresponding to FIG. 1 showing another embodiment.

OTHER EMBODIMENTS (a) The structure such as shown in FIG. 6 may be employed to practice the present invention.

Referring to FIG. 6, the connection conductive portion 4 extends to one edge of the ceramic sheet 1. The connection conductive portion 6 extends to that one of the edges of the ceramic sheet 2 which orthogonally intersects the edge to which extends the connection conductive portion 4. The connection conductive portion 8 extends to the edge which is parallel to the edge to which extends the connection conductive portion 4 and orthogonal to the edge to which extends the connection conductive portion 6. The connection conductive portions 4, 6 and 8 are not overlapped with each other in the direction of the thickness in this structure.

(b) The piezoelectric resonance device in accordance with the present invention may be manufactured through the manufacturing steps shown in FIG. 7.

Figure 7A:
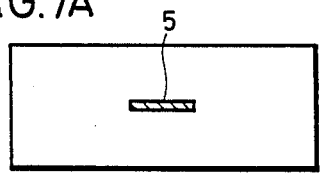
FIGS. 7A to 7D are vertical sectional views showing another method of manufacturing the piezoelectric resonance device in accordance with the present invention.

First, two ceramic green sheets are prepared, an electrode paste is applied between the both ceramic green sheets to form an electrode 5, these components are stacked under pressure, and the provided body is fired. The fired body such as shown in FIG. 7A is provided through these steps. Thereafter, electrodes 3 and 7 are formed by burning or depositing a conductive metal such as silver to provide the state shown in FIG. 7B. Thereafter, conductive pastes 3b and 7b are applied entirely on the upper end surface and the lower end surface of the piezoelectric resonance device. The whole piezoelectric resonance device is polarized by using the both conductive pastes 3b and 7b as electrodes to provide the state shown in FIG. 7C. By removing the conductive pastes 3b and 7b by a solvent, the piezoelectric resonance device such as shown in FIG. 7D can be provided.

Figure 7B:
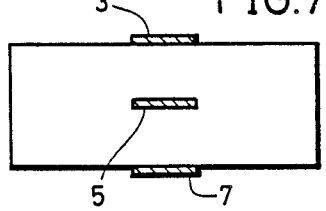
Figure 7C:
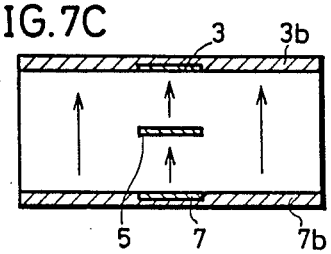
Figure 7D:
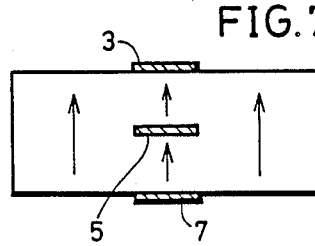

The body in the state of FIG. 7B can be provided by applying conductive pastes for the electrodes 3 and 7 prior to the firing and by cofiring.

Figure 8:
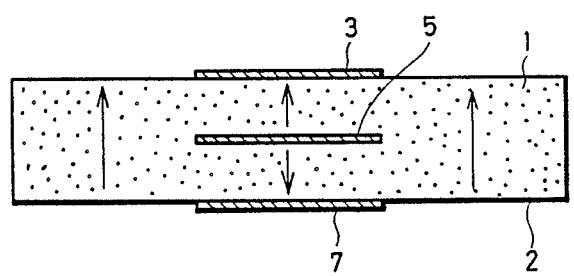
FIG. 8 corresponds to FIG. 3 showing a further embodiment.

(c) The piezoelectric resonance device in accordance with the present invention can be provided by alternating the direction of polarization of the piezoelectric material layers sandwiched by the electrodes 3, 5 and 7 in the direction of the thickness, as shown in FIG. 8.

When the piezoelectric resonance device shown in FIG. 8 is to be driven, no lead wire is connected to the electrode 5, and + or − voltage is applied to the electrodes 3 and the electrode 7 is connected to the ground.

Figure 5D:
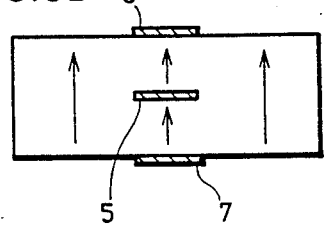

In manufacturing the piezoelectric resonance device having the structure of FIG. 8, the structure of FIG. 5D or FIG. 7D is prepared, a higher voltage is applied to the electrode 5 and a lower voltage is applied to the electrode 7 for polarization in opposite directions. By doing so, the piezoelectric resonance device having the structure shown in FIG. 8 can be provided.

Figure 9I:
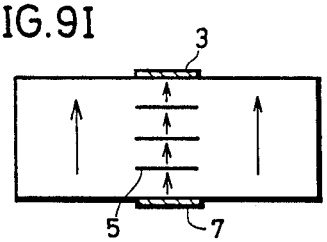
FIGS. 9A to 9N are vertical sectional views of the piezoelectric resonance devices of still further embodiments, respectively.
Figure 9J:
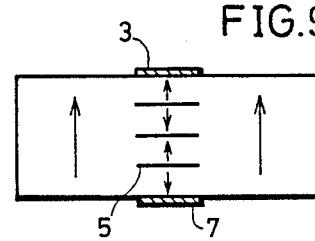
Figure 9K:
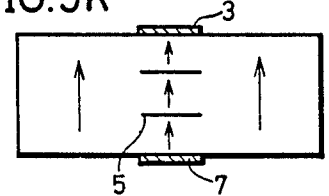
Figure 9L:
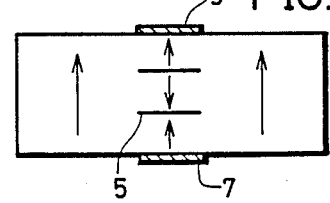
Figure 9M:
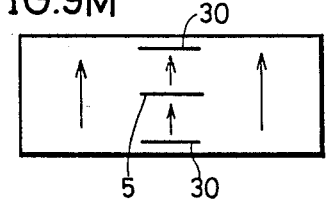
Figure 9N:
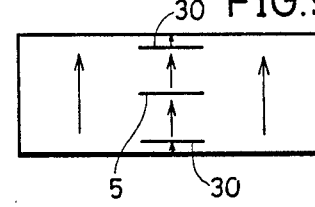
Figure 9A:
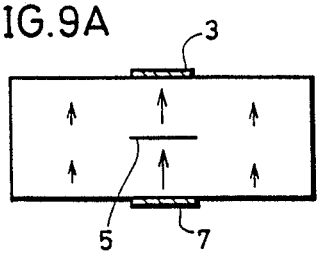

(d) FIGS. 9A to 9N respectively show other embodiments.

Figure 9B:
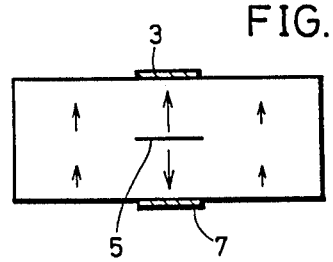

In FIG. 9A, the polarization of those portions of the piezoelectric material layers interposed between the electrodes 3, 5 and 7 is set to be larger than the polarization of those portions of the piezoelectric material layers which are not interposed between the electrodes 3, 5 and 7. In FIG. 9B, the same structure as shown in FIG. 9A is employed with the direction of polarization being alternate in the pizeoelectric material layers sandwiched by the electrodes 3, 5 and 7.

Figure 9C:
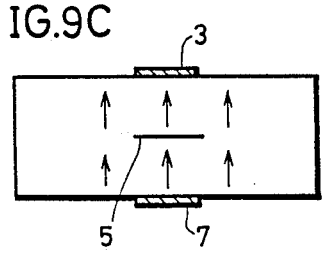
Figure 9D:
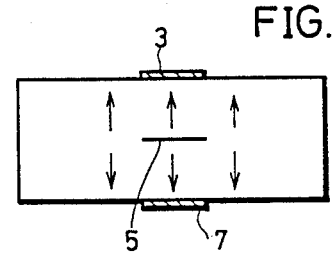

In FIG. 9C, in the piezoelectric material layers which are not interposed between the electrodes 3, 5 and 7, the direction of polarization of the portions near the electrodes 3, 5 and 7 is polarized in the same direction of the portions of the piezoelectric material layers interposed between the electrodes 3, 5 and 7, peripheral portion of the piezoelectric resonance device is not polarized. In FIG. 9D, the same structure as shown in FIG. 9C is employed with the direction of polarization being alternate in the piezoelectric material layers sandwiched by the electrodes 3, 5 and 7.

Figure 9E:
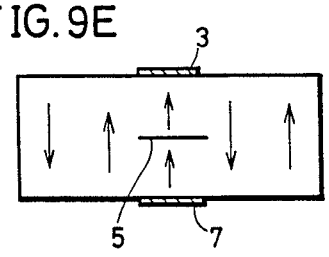
Figure 9F:
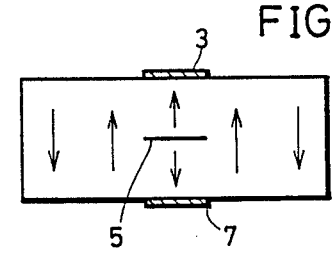

Referring to FIG. 9E, in the piezoelectric material layers which are not interposed between the electrodes 3, 5 and 7, the direction of polarization of the portions near the electrodes 3, 5 and 7 is opposite to the direction of polarization of the peripheral portions of the piezoelectric resonance device. In FIG. 9F, the same structure as shown in FIG. 9E is employed with the direction of polarization being alternate in the piezoelectric material layers interposed between the electrodes 3, 5 and 7.

Figure 9G:
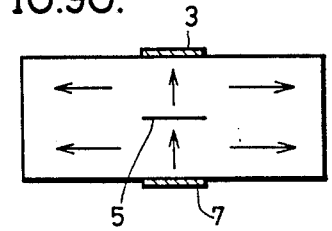
Figure 9H:
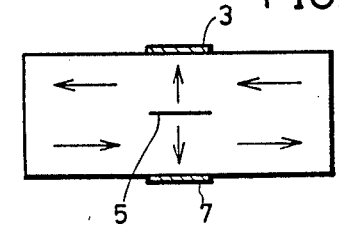

In FIG. 9G, the direction of polarization of the piezoelectric material layers which are not sandwiched by the electrodes 3, 5 and 7 is orthogonal to the direction of thickness of the piezoelectric resonance device. In FIG. 9H, the same structure as shown in FIG. 9G is employed with the direction of polarization of the piezoelectric material layers interposed between the electrodes 3, 5 and 7 being alternate.

FIG. 9I shows an embodiment in which the number of inner electrodes is three or more, and the number of electrodes in total is odd. FIG. 9J shows a case in which the number of inner electrodes is two or more and the number of electrodes in total is odd with the direction of polarization of the piezoelectric material layers interposed between the electrodes being alternate in the direction of thickness.

FIG. 9K shows an embodiment in which the number of inner electrodes is two or more, and the number of electrodes in total is even. FIG. 9L shows an embodiment in which the number of inner electrodes is two or more and the number of electrodes in total in even, with the direction of polarization of the piezoelectric material layers interposed between the electrodes being alternate in the direction of the thickness.

FIG. 9M shows a case in which the electrodes 30 on the upper and lower ends are not external electrodes but inner electrodes arranged near the surface layers. In the embodiment shown in FIG. 9M, the portions between the electrodes 30 and the surface layers are not polarized. FIG. 9N shows a case in which the piezoelectric material layer arranged between the electrode 30 and the surface layer is polarized in the same structure as shown in FIG. 9M.

Any of the above described embodiments can provide the effect of the present invention.

Although the present invention has been described and illustrated in detail in connection with embodiments thereof, it is clearly understood that the same is by way of illustration and example only and is not to be taken by way of limitation, the spirit and scope of the present invention being limited only by the terms of the appended claims.

What is claimed is:

1. An energy-trapping-by-frequency-lowering-type piezoelectric resonance device utilizing higher order harmonics above the fundamental wave of a thickness extensional mode of vibration, said device comprising:
   a plate-shaped body formed of piezoelectric material layers; and
   electrodes arranged so as to be separated by said piezoelectric material layers in a direction of thickness of said body and to trap vibration energy by lowering the resonance frequency; wherein
   the portions of the piezoelectric material layers sandwiched by said electrodes are polarized;
   at least portions of the piezoelectric material layers which are not interposed between said electrodes are polarized; and
   said piezoelectric material has such an effective Poisson's ratio that the piezoelectric material is not usable for fundamental mode energy trapping of the thickness extensional vibration mode by lowering the resonance frequency.

2. A piezoelectric resonance device according to claim 1, wherein
   the number of said electrodes is three or more, and
   the piezoelectric material layers interposed between said electrodes are polarized in alternating directions in the direction of the thickness.

3. A piezoelectric resonance device according to claim 1, wherein
   the number of said electrodes is three or more; and
   the piezoelectric material layers interposed between said electrodes are polarized in the same direction in the direction of the thickness.

4. A piezoelectric resonance device according to claim 1, further comprising connection conductive portions extending from said electrodes to side edges of the body formed of said piezoelectric material layers;
   said connection conductive portions having respective potentials when said piezoelectric resonance device is driven; and wherein
   at least those of said connection conductive portions which have potentials opposite to each other when driven are formed not overlapping with each other in the direction of thickness.

5. A piezoelectric resonance device according to claim 1, wherein
   the number of said electrodes is odd and an even-number harmonic is utilized.

6. A piezoelectric resonance device according to claim 5, wherein the piezoelectric material has an effective Poisson's ratio of less than $\frac{1}{3}$.

* * * * *